United States Patent
Ye et al.

(10) Patent No.: US 12,374,903 B2
(45) Date of Patent: Jul. 29, 2025

(54) DISCHARGE CONTROL METHOD AND CHARGE CONTROL METHOD OF BATTERY PACK CONTROL SYSTEM

(71) Applicant: CONTEMPORARY AMPEREX TECHNOLOGY (HONG KONG) LIMITED, Hong Kong (CN)

(72) Inventors: Wei Ye, Ningde (CN); Bo Zeng, Ningde (CN); Shuting Sun, Ningde (CN); Jihai Xie, Ningde (CN); Yongchao Li, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 181 days.

(21) Appl. No.: 18/344,099

(22) Filed: Jun. 29, 2023

(65) Prior Publication Data

US 2023/0344246 A1 Oct. 26, 2023

Related U.S. Application Data

(63) Continuation of application No. PCT/CN2021/125410, filed on Oct. 21, 2021.

(51) Int. Cl.
  *H02J 7/00* (2006.01)
(52) U.S. Cl.
  CPC .......... *H02J 7/0016* (2013.01); *H02J 7/0047* (2013.01); *H02J 7/00714* (2020.01); *H02J 7/007184* (2020.01)
(58) Field of Classification Search
  USPC ........................................................ 320/126
  See application file for complete search history.

(56) References Cited

U.S. PATENT DOCUMENTS

2008/0272736 A1* 11/2008 Tien .................... H02J 7/00302
  320/132
2021/0226267 A1 7/2021 Books et al.

FOREIGN PATENT DOCUMENTS

CN 104425852 A 3/2015
CN 108258748 A 7/2018
(Continued)

OTHER PUBLICATIONS

Extended European search report for EP application No. 21960992.2, dated Apr. 26, 2024.
(Continued)

*Primary Examiner* — Samuel Berhanu
(74) *Attorney, Agent, or Firm* — Ladas & Parry LLP

(57) ABSTRACT

A discharging control method and a charging control method for a battery pack control system are provides. The battery pack control system includes a master battery management unit and multiple slave battery management units. The master battery management unit controls the slave battery management units. The slave battery management units controls battery packs to connect to an operating circuit or disconnect from the operating circuit. In the discharging control method and the charging control method, a loop current generated from connecting a battery pack to an operating circuit is predicted each time before a slave battery management unit controls the battery pack to connect to the operating circuit, and the battery pack is controlled to connect to the operating circuit with the generated loop current within a safe value range.

12 Claims, 5 Drawing Sheets

(56) References Cited

FOREIGN PATENT DOCUMENTS

| CN | 112519634 A | 3/2021 |
|---|---|---|
| JP | 2014073051 A | 4/2014 |
| JP | 2019161781 A | 9/2019 |
| KR | 20200066838 A | 6/2020 |

OTHER PUBLICATIONS

Notice of Reasons for Refusal for JP application No. 2023-541661, dated May 28, 2024.
International Search Report for International Application No. PCT/CN2021/125410, mailed Jul. 5, 2022.
Written Opinion of International Searching Authority for International Application No. PCT/CN2021/125410, mailed Jul. 5, 2022.

\* cited by examiner

DISCHARGE CONTROL METHOD AND CHARGE CONTROL METHOD OF BATTERY PACK CONTROL SYSTEM

CROSS REFERENCE OF RELATED APPLICATION

This application is a continuation of International Patent Application No. PCT/CN2021/125410, filed on Oct. 21, 2021, which is incorporated by reference in its entirety.

TECHNICAL FIELD

This application relates to the technical field of charging and discharging control for energy storage systems, and specifically to a discharging control method and a charging control method for a battery pack control system.

BACKGROUND

At present, lithium battery packs for energy storage systems and electric vehicles are mostly provided in the form of multiple parallel-connected battery packs, so as to meet the capacity and performance requirements of the energy storage systems and electric vehicles. With the increase of system scale, more battery packs are connected in parallel. Due to variances in parameters such as battery voltage, internal resistance, and self-discharge rate among the parallel-connected battery packs, current unbalance, even a loop current in severe cases, may be caused. This affects the service life and performance of the energy storage system, and causes safety hazards.

When a plurality of battery packs are connected in parallel, a voltage difference is present between branch circuits where the plurality of battery packs are located. On condition that the branch circuits are directly closed, if the voltage difference between the branch circuits is excessively large, a loop current generated by the voltage difference will impact the relay, resulting in sticking or shorter service life, or causing damage to battery cells. During charging, a voltage difference is present between branch circuits where the plurality of battery packs are located. If a branch circuit with an excessive voltage difference is not closed, the branch circuit cannot be charged, and if a time-based closing manner is used, a longer charging time will be caused. Similarly, during discharging, the voltage difference between the branch circuits where the plurality of battery packs are located is excessively large. If the branch circuit with an excessive voltage difference is not closed, problems such as restricted output power, reduced driving range, and unbalanced use of battery packs in branch circuits of a multi-branch system will be caused.

In the prior art, a balancing resistor is used for current balance control on parallel-connected battery packs. However, the balancing resistor is a lossy device, and therefore use of the balancing resistor will consume energy of the system and cause waste of energy.

SUMMARY

Embodiments of this application are intended to provide a discharging control method and a charging control method for a battery pack control system, so as to solve the technical defect of the prior art that a voltage difference between branch circuits where multiple battery packs are located is so large that a branch circuit can hardly be closed properly and connected to the operating circuit during charging and discharging. Moreover, in the technical solution provided in this application, parallel-connected battery packs are closed not by using the existing balancing resistor solution, which avoids the technical defect of energy waste.

An embodiment of this application provides a discharging control method for a battery pack control system. The battery pack control system includes a master battery management unit and N slave battery management units for controlling N parallel-connected battery packs, where the slave battery management units are configured to control the battery packs to connect to an operating circuit or disconnect from the operating circuit, the slave battery management units are in communication connection with the master battery management unit, and N is a positive integer greater than or equal to 2.

The discharging control method is applied to the master battery management unit, and the discharging control method includes:

at a first time, obtaining first voltage values of the N parallel-connected battery packs, determining a first battery pack with the largest first voltage value, and sending, to a slave battery management unit corresponding to the first battery pack, a control instruction for connecting the first battery pack to the operating circuit;

at an i-th time, obtaining i-th voltage values of (N−i+1) battery packs not connected to the operating circuit and an i-th sampling voltage, where the i-th sampling voltage is a voltage of (i−1) parallel-connected battery packs connected to the operating circuit; calculating differences between all the i-th voltage values and the i-th sampling voltage to obtain (N−i+1) differences; and obtaining, from the (N−i+1) differences, $M_i$ differences less than corresponding voltage difference thresholds, determining an i-th battery pack with the largest voltage among $M_i$ battery packs corresponding to the $M_i$ differences, and sending, to a slave battery management unit corresponding to the i-th battery pack, a control instruction for connecting the i-th battery pack to the operating circuit; where i is a positive integer greater than or equal to 2, and $M_i$ is an integer greater than or equal to 0; and outputting a discharge allowed instruction when $M_i=0$.

In the foregoing technical solution, the battery pack control system includes a master battery management unit and multiple slave battery management units. The master battery management unit is configured to control the slave battery management units, and the slave battery management units are configured to control battery packs to connect to an operating circuit or disconnect from the operating circuit. A loop current generated from connecting a battery pack to the operating circuit is predicted each time before a slave battery management unit controls the battery pack to connect to the operating circuit, and the battery pack is controlled to connect to the operating circuit within a safe value range of loop current. Without relying on a balancing resistor, the control method avoids energy loss and effectively protects battery cells of the battery pack connected to the circuit and a relay (a function of the relay is to connect a battery pack to the operating circuit or disconnect a battery pack from the operating circuit by turning on or off the relay) from damage caused by impact of loop currents.

In some optional implementations, the step of obtaining, from the (N−i+1) differences, $M_i$ differences less than corresponding voltage difference thresholds includes:

obtaining the voltage difference thresholds based on an allowable discharge current of each of the (N−i+1)

battery packs not connected to the operating circuit and an internal resistance of the corresponding battery pack.

In the foregoing technical solution, each of the voltage difference thresholds corresponding to the (N−i+1) differences is a threshold that dynamically changes in real time. Such voltage difference threshold is obtained based on the allowable discharge current and internal resistance of each battery pack, where the allowable discharge current of the battery pack is the allowable discharge current under a temperature and an SOC value of the battery pack at a current time or a maximum loop current when the relay is turned on.

In some optional implementations, the method further includes:
  determining that a current time is the i-th time after receiving an instruction indicating completion of connecting the (i−1)-th battery pack to the operating circuit; where the instruction indicating completion of connecting the (i−1)-th battery pack to the operating circuit is sent by a slave battery management unit corresponding to the (i−1)-th battery pack.

In the foregoing technical solution, after the master battery management unit sends, to the slave battery management unit corresponding to the (i−1)-th battery pack, an instruction for connecting the (i−1)-th battery pack to the operating circuit, the slave battery management unit corresponding to the (i−1)-th battery pack will perform an open-circuit diagnosis on a relay of the (i−1)-th battery pack. If no open-circuit fault is present, the slave battery management unit corresponding to the (i−1)-th battery pack determines that the relay of the (i−1)-th battery pack has been turned on and sends, to the master battery management unit, an instruction indicating completion of connecting the (i−1)-th battery pack to the operating circuit. After receiving this instruction, the master battery management unit determines that the current time is the i-th time. During the discharging control process, the open-circuit diagnosis is performed each time the relay of the battery pack is controlled to be turned on, to ensure smooth implementation of the subsequent control process.

In some optional implementations, the discharging control method further includes:
  obtaining a sampling voltage, a sampling current, and a voltage of a battery pack not connected to the operating circuit, and sending, to a slave battery management unit corresponding to a battery pack meeting a first condition, a control instruction for connecting the battery pack to the operating circuit; where the first condition includes: calculating a difference between the voltage of the battery pack not connected to the operating circuit and the sampling voltage, and when the difference is within a corresponding voltage difference range, determining that the sampling current is less than a specified threshold and remains for a preset period of time.

A range of the voltage difference between the voltage $V_{BatVolt}$ of the battery pack not connected to the operating circuit and the sampling voltage $V_{LINK}$ is $\Delta V_{min} < (V_{BatVolt} - V_{LINK}) < \Delta V_{max}$; where $\Delta V_{min} = \Delta V - U_0$, $\Delta V_{max} = \Delta V + U_0$, $\Delta V$ is a product of a maximum loop current and an internal resistance, and $U_0$ is a specified sampling error and a tolerance threshold for determining overcurrent.

In the foregoing technical solution, after connection for a high voltage is completed during discharging control, the master battery management unit monitors change of the sampling voltage in real time during operation of an electric vehicle or another electric device, predicts the timing of connecting a remaining battery pack that has not been connected to the operating circuit to the operating circuit, and sends, at that timing to a slave battery management unit corresponding to the battery pack, a control instruction for connecting the battery pack to the operating circuit. In this way, all the battery packs with large voltage differences can be connected to the operating circuit, avoiding the problems of insufficient output power and shorter driving range caused by discharge failure of some battery packs due to voltage difference.

In some optional implementations, the discharging control method further includes:
  obtaining a sampling voltage, a sampling current, and a voltage of a battery pack not connected to the operating circuit, and sending, to a slave battery management unit corresponding to a battery pack meeting a second condition, a control instruction for connecting the battery pack to the operating circuit; where the second condition includes: calculating a difference between the voltage of the battery pack not connected to the operating circuit and the sampling voltage, and when the difference is within a voltage difference range, reducing the sampling current by controlling output power, and determining that the sampling current is less than a specified threshold and remains for a preset period of time.

In the foregoing technical solution, after connection for a high voltage is completed during discharging control, the master battery management unit monitors change of the sampling voltage in real time during operation of an electric vehicle or another electric device, predicts and controls the timing of connecting a remaining battery pack that has not been connected to the operating circuit to the operating circuit, and sends, at that timing to a slave battery management unit corresponding to the battery pack, a control instruction for connecting the battery pack to the operating circuit. This avoids the voltage difference of the battery packs to be further enlarged, improves the consistency between battery cells, and enables battery packs with a large voltage difference to be all connected to the operating circuit, avoiding the problems of insufficient output power and shorter driving range caused by discharging failure of some battery packs due to voltage difference.

In some optional implementations, the discharging control method further includes:
  dynamically adjusting allowable discharge power until a discharge current of a battery pack connected to the operating circuit decreases to a level that does not impair a capacitive life of a relay, and sending, to a slave battery management unit corresponding to the battery pack, an instruction for disconnecting the battery pack from the operating circuit; and
  after receiving an instruction indicating completion of disconnecting the battery pack from the operating circuit, requesting new allowable discharge power based on all battery packs connected to the operating circuit.

In the foregoing technical solution, during discharging, before the battery pack is disconnected from the operating circuit, current is reduced by dynamically adjusting the allowable discharging power until the current decreases to a level that does not impair the capacitive life of the relay, and then the relay is controlled to be off to disconnect the battery pack from the operating circuit. This protects the relay from being damaged when the battery pack is disconnected from the operating circuit.

An embodiment of this application provides a charging control method for a battery pack control system. The charging control method is applied to a master battery management unit, and the charging control method includes:

at a first time, obtaining first voltage values of N parallel-connected battery packs, determining a first battery pack with the smallest first voltage value, and sending, to a slave battery management unit corresponding to the first battery pack, a control instruction for connecting the first battery pack to an operating circuit; where N is a positive integer greater than or equal to 2;

at a j-th time, obtaining j-th voltage values of (N−j+1) battery packs not connected to the operating circuit and a j-th sampling voltage, where the j-th sampling voltage is a voltage of (j−1) parallel-connected battery packs connected to the operating circuit; calculating differences between all the j-th voltage values and the j-th sampling voltage to obtain (N−j+1) differences; and obtaining, from the (N−j+1) differences, $P_j$ differences less than corresponding voltage difference thresholds, determining a j-th battery pack with the smallest voltage among $P_j$ battery packs corresponding to the $P_j$ differences, and sending, to a slave battery management unit corresponding to the j-th battery pack, a control instruction for connecting the j-th battery pack to the operating circuit; where j is a positive integer greater than or equal to 2, and $P_j$ is an integer greater than or equal to 0; and outputting a charge allowed instruction when $P_j=0$.

In the foregoing technical solution, the battery pack control system includes a master battery management unit and multiple slave battery management units. The master battery management unit is configured to control the slave battery management units, and the slave battery management units are configured to control battery packs to connect to an operating circuit or disconnect from the operating circuit. During the charging control process, a loop current generated from connecting a battery pack to the operating circuit is predicted each time before the slave battery management unit controls the battery pack to connect to the operating circuit, and the battery pack is controlled to connect to the operating circuit within a safe value range of loop current. Without relying on a balancing resistor, the control method avoids energy loss and effectively protects battery cells of the battery pack connected to the circuit and a relay (a function of the relay is to connect a battery pack to the operating circuit or disconnect a battery pack from the operating circuit by turning on or off the relay) from damage caused by impact of loop currents.

In some optional embodiments, the step of obtaining, from the (N−j+1) differences, $P_j$ differences less than corresponding voltage difference thresholds includes:

obtaining the voltage difference thresholds based on an allowable charge current of each of the (N−j+1) battery packs not connected to the operating circuit and an internal resistance of the corresponding battery pack.

In the foregoing technical solution, each of the voltage difference thresholds corresponding to the (N−j+1) differences is a threshold that dynamically changes in real time. Such voltage difference threshold is obtained based on the allowable charge current and internal resistance of each battery pack, where the allowable charge current of the battery pack is the allowable charge current under a temperature and an SOC value of the battery pack at a current time or a maximum loop current when the relay is turned on.

In some optional implementations, the method further includes:

determining that a current time is the j-th time after receiving an instruction indicating completion of connecting a (j−1)-th battery pack to the operating circuit; where the instruction indicating completion of connecting the (j−1)-th battery pack to the operating circuit is sent by a slave battery management unit corresponding to the (j−1)-th battery pack.

In the foregoing technical solution, after the master battery management unit sends, to the slave battery management unit corresponding to the (j−1)-th battery pack, an instruction for connecting the (j−1)-th battery pack to the operating circuit, the slave battery management unit corresponding to the (j−1)-th battery pack will perform an open-circuit diagnosis on a relay of the (j−1)-th battery pack. If no open-circuit fault is present, the slave battery management unit corresponding to the (j−1)-th battery pack determines that the relay of the (j−1)-th battery pack has been turned on and sends, to the master battery management unit, an instruction indicating completion of connecting the (j−1)-th battery pack to the operating circuit. After receiving this instruction, the master battery management unit determines that the current time is the j-th time. During the charging control process, the open-circuit diagnosis is performed each time the relay of the battery pack is controlled to be turned on, to ensure smooth implementation of the subsequent control process.

In some optional implementations, a sampling voltage, a sampling current, and a voltage of a battery pack not connected to the operating circuit are obtained, and a control instruction for connecting a battery pack to the operating circuit is sent to a slave battery management unit corresponding to a battery pack meeting a third condition; where the third condition includes: calculating a difference between the voltage of the battery pack not connected to the operating circuit and the sampling voltage, and if the difference is within a corresponding voltage difference range, performing reduced-rate charging control on all battery packs connected to the operating circuit until a charging rate drops to a target value.

In the foregoing technical solution, after connection for a high voltage is completed during charging control, the plurality of parallel-connected battery packs connected to the operating circuit start to be charged. During charging, the master battery management unit monitors change of the sampling voltage in real time, predicts and controls the timing of connecting a remaining battery pack that has not connected to the operating circuit to the operating circuit, and sends, at that timing to a slave battery management unit corresponding to the battery pack, a control instruction for connecting the battery pack to the operating circuit. This avoids charging overcurrent caused by loop currents generated from connecting battery packs to the operating circuit during charging, and enables the battery packs with a large voltage difference to be all connected to the operating circuit, thereby solving the problem that the battery packs with a large voltage difference cannot be charged, and effectively improving battery availability.

In some optional implementations, the performing reduced-rate charging control on all battery packs connected to the operating circuit until a charging rate drops to a target value includes:

when the difference between the voltage $V_{BatVolt}$ of the battery pack not connected to the operating circuit and the sampling voltage $V_{LINK}$ is within a voltage difference range $\Delta V_{min} < (V_{BatVolt} - V_{LINK}) < \Delta V_{max}$, performing charging at a charging rate σi obtained by multiplying a current look-up charging rate by a gradient coefficient φi, performing charging at the sampling voltage until $V_{LINK}=\Delta V+V_{BatVolt}$ and remains unchanged for τs, and then changing to a next gradient coefficient, where $\Delta V_{min}=\Delta V-U_0$, $\Delta V_{max}=\Delta V+U_0$; $\Delta V$ is a product of a maximum loop current and an internal resistance, and $U_0$ is a specified sampling error and a tolerance threshold for determining overcurrent; and repeating the foregoing steps until σi=0.1 C, and performing charging at the sampling voltage until $V_{LINK}=\Delta V+V_{BatVolt}$ and remains unchanged for τS.

In some optional embodiments, the charging control method further includes:

dynamically adjusting allowable charging power until a charge current of a battery pack connected to the operating circuit decreases to a level that does not impair a capacitive life of a relay, and sending, to a slave battery management unit corresponding to the battery pack, an instruction for disconnecting the battery pack from the operating circuit; and after receiving an instruction indicating completion of disconnecting the battery pack from the operating circuit, requesting new allowable charging power based on all battery packs connected to the operating circuit.

In the foregoing technical solution, during charging, before the battery pack is disconnected from the operating circuit, current is reduced by dynamically adjusting the allowable charging power until the current decreases to a level that does not impair the capacitive life of the relay, and then the relay is controlled to be off to disconnect the battery pack from the operating circuit. This protects the relay from being damaged when the battery pack is disconnected from the operating circuit.

The foregoing description is merely an overview of the technical solution of this application. For a better understanding of the technical means in this application such that they can be implemented according to the content of the specification, and to make the above and other objectives, features and advantages of this application more obvious and easier to understand, the following describes specific embodiments of this application.

BRIEF DESCRIPTION OF DRAWINGS

In order to describe the technical solutions in the embodiments of this application more clearly, the following briefly describes the accompanying drawings required for describing the embodiments of this application. It is appreciated that the accompanying drawings below only show some embodiments of this application and thus should not be considered as limitations on the scope. Persons of ordinary skill in the art may still derive other related drawings from the accompanying drawings without creative efforts.

DETAILED DESCRIPTION

Figure 1:
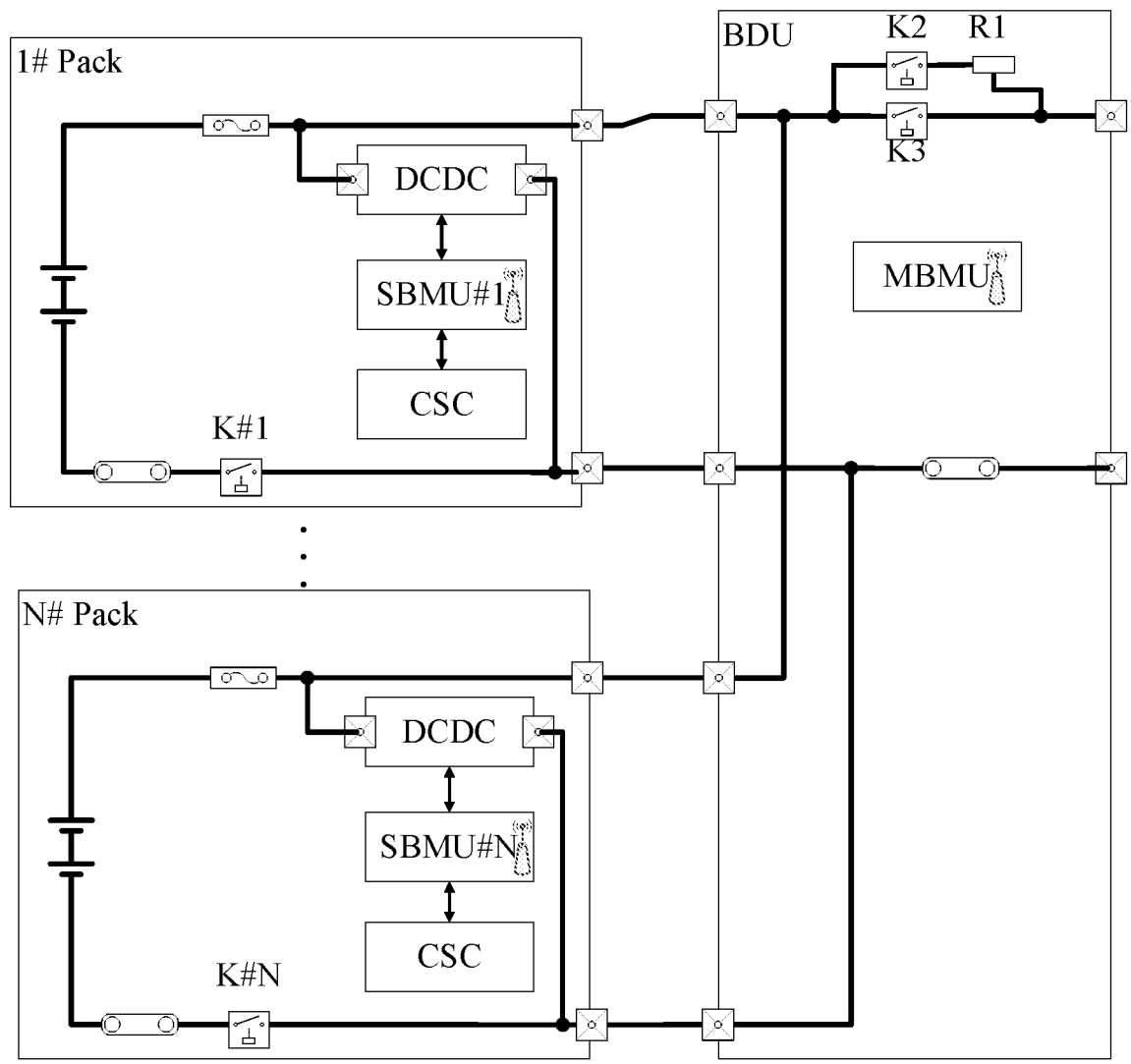
FIG. 1 is a schematic diagram of a structure of a battery pack control system according to an embodiment of this application.

The following describes in detail the embodiments of technical solutions of this application with reference to the accompanying drawings. The following embodiments are merely intended for a clearer description of the technical solutions of this application and therefore are used as just examples which do not constitute any limitations on the protection scope of this application.

Unless otherwise defined, all technical and scientific terms used herein shall have the same meanings as commonly understood by those skilled in the art to which this application relates. The terms used herein are intended to merely describe the specific embodiments rather than to limit this application. The terms "include", "comprise", and "have" and any other variations thereof in the specification, claims and brief description of drawings of this application are intended to cover non-exclusive inclusions.

In the description of the embodiments of this application, the terms "first", "second" and the like are merely intended to distinguish between different objects, and shall not be understood as any indication or implication of relative importance or any implicit indication of the number, sequence or primary-secondary relationship of the technical features indicated. In the description of this application, "a plurality of" means at least two unless otherwise specifically stated.

In this specification, reference to "embodiment" means that specific features, structures or characteristics described with reference to the embodiment may be incorporated in at least one embodiment of this application. The word "embodiment" appearing in various places in the specification does not necessarily refer to the same embodiment or an independent or alternative embodiment that is exclusive of other embodiments. It is explicitly or implicitly understood by persons skilled in the art that the embodiments described herein may be combined with other embodiments.

In the description of the embodiments of this application, the term "and/or" is only an associative relationship for describing associated objects, indicating that three relationships may be present. For example, A and/or B may indicate the following three cases: presence of only A, presence of both A and B, and presence of only B. In addition, the character "/" in this specification generally indicates an "or" relationship between contextually associated objects. In the description of the embodiments of this application, the term "a plurality of" means more than two (inclusive). Similarly, "a plurality of groups" means more than two (inclusive) groups, and "a plurality of pieces" means more than two (inclusive) pieces.

In the description of the embodiments of this application, unless otherwise specified and defined explicitly, the terms "mount", "connect", "join", and "fasten" should be understood in their general senses. For example, they may refer to a fixed connection, a detachable connection, or an integral connection, may refer to a mechanical connection or electrical connection, and may refer to a direct connection, an indirect connection via an intermediate medium, or an interaction between two elements. Persons of ordinary skill in the art can understand specific meanings of these terms in this application as appropriate to specific situations.

At present, lithium battery packs for energy storage systems and electric vehicles are mostly provided in the form of multiple parallel-connected battery packs, so as to meet the capacity and performance requirements of the energy storage systems and electric vehicles. However, a voltage difference is present between multiple voltages of the multiple battery packs. If a relay in the battery packs is turned on directly for implementing parallel connection, a loop current generated by an excessively large voltage difference will impact the relay, resulting in sticking or shorter service life or causing damage to battery cells. During charging, some battery packs cannot be charged in the case of an excessively large voltage difference. During discharging, some battery packs cannot be discharged in the case of an excessively large voltage difference, restricting output power and reducing the driving range.

To solve the problem that some parallel-connected battery packs cannot be charged or discharged due to the voltage difference, the applicants have found through research that a balancing resistor can be used to perform current balance control on parallel-connected battery packs. However, the current balancing capability is limited, and the balancing resistor is a lossy device, which will consume energy of a system.

Based on the foregoing considerations, to solve the problem of energy loss caused by use of the balancing resistor, the inventors have designed a discharging control method and a charging control method for a battery pack control system through in-depth research. A loop current generated from connecting a battery pack to an operating circuit is predicted each time before a slave battery management unit controls the battery pack to connect to the operating circuit, and the battery pack is controlled to connect to the operating circuit while the generated loop current is within a safe value range. The control methods do not rely on a balancing resistor, avoiding energy loss.

The discharging control method and charging control method disclosed in the embodiments of this application are suitable for controlling the charging or discharging of multiple parallel-connected battery packs. The multiple parallel-connected battery packs may be used in, without limitation to, an electric apparatus such as a mobile phone, a tablet computer, a laptop computer, an electric toy, a power tool, an electric bicycle, an electric vehicle, a ship, and a spacecraft. The electric toy may be a fixed or mobile electric toy, for example, a game console, an electric toy car, an electric toy ship, and an electric toy airplane. The spacecraft may include an airplane, a rocket, a space shuttle, a spaceship, and the like.

For ease of description, the electric apparatus according to an embodiment of this application being an electric vehicle is used as for description of the following embodiments.

Referring to FIG. 1, FIG. 1 is a schematic diagram of a structure of a battery pack control system according to an embodiment of this application. The battery pack control system includes a master battery management unit and N slave battery management units for controlling N parallel-connected battery packs. The slave battery management unit controls the battery pack to connect to the operating circuit or disconnect from the operating circuit by controlling a relay in the battery pack to be on or off. The slave battery management units are in communication connection with the master battery management unit, where N is a positive integer greater than or equal to 2.

In some embodiments of this application, the slave battery management unit may be implemented using a battery management system (BMS) for the corresponding battery pack; and the master battery management unit may be implemented using a control module of a battery disconnect unit (BDU) or using a battery management system of one of the battery packs.

Figure 2:
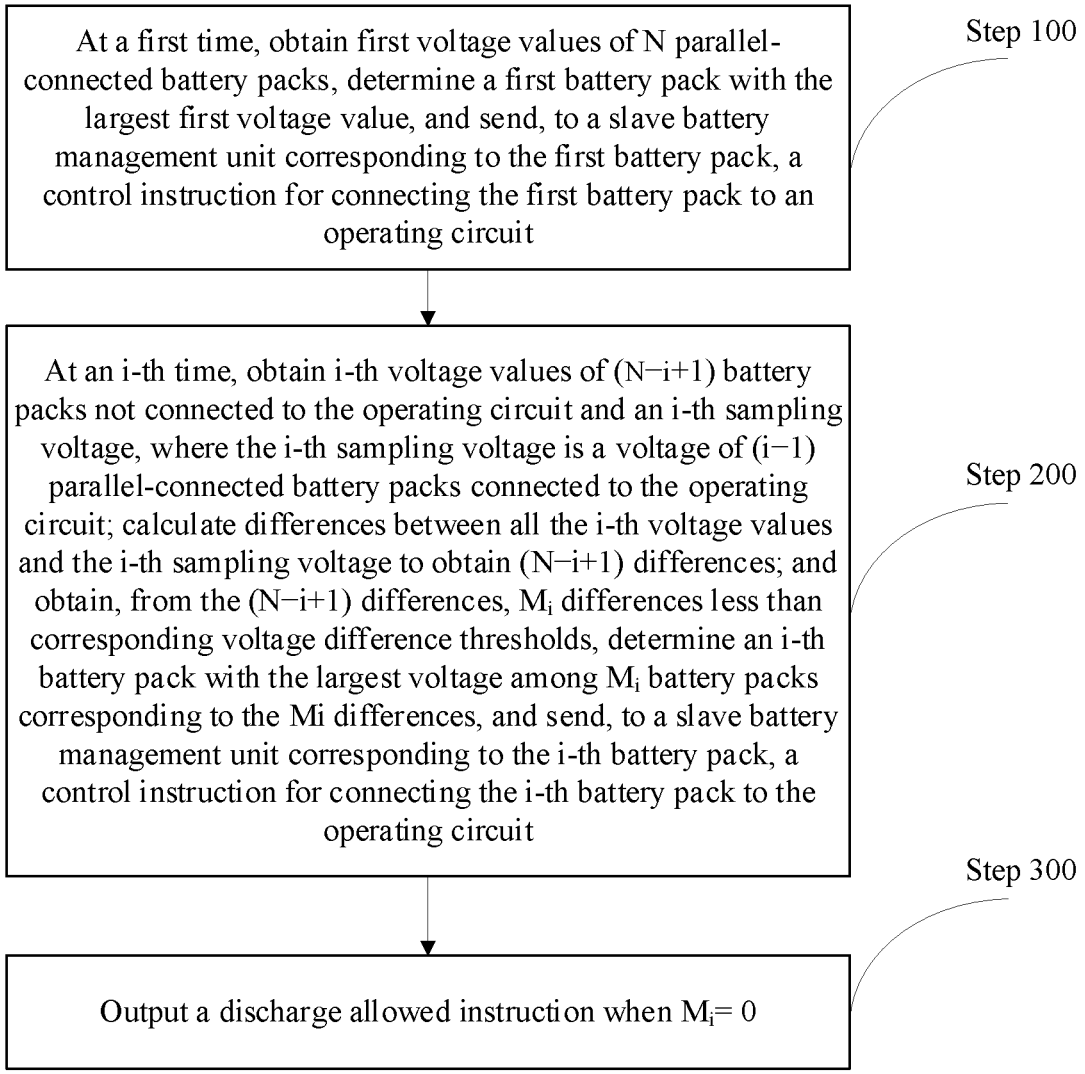
FIG. 2 is a flowchart of steps of a discharging control method for a battery pack control system according to an embodiment of this application.

Referring to FIG. 2, FIG. 2 is a flowchart of steps of a discharging control method for a battery pack control system according to an embodiment of this application. The discharging control method is applied to a master battery management unit, and the discharging control method includes step 100 to step 300.

Step 100. At a first time, obtain first voltage values of N parallel-connected battery packs, determine a first battery pack with the largest first voltage value, and send, to a slave battery management unit corresponding to the first battery pack, a control instruction for connecting the first battery pack to an operating circuit.

Step 200. At an i-th time, obtain i-th voltage values of (N−i+1) battery packs not connected to the operating circuit and an i-th sampling voltage, where the i-th sampling voltage is a voltage of (i−1) parallel-connected battery packs connected to the operating circuit; calculate differences between all the i-th voltage values and the i-th sampling voltage to obtain (N−i+1) differences; and obtain, from the (N−i+1) differences, $M_i$ differences less than corresponding voltage difference thresholds, determine an i-th battery pack with the largest voltage among $M_i$ battery packs corresponding to the $M_i$ differences, and send, to a slave battery management unit corresponding to the i-th battery pack, a control instruction for connecting the i-th battery pack to the operating circuit; where i is a positive integer greater than or equal to 2, and $M_i$ is an integer greater than or equal to 0.

Step 300. Output a discharge allowed instruction when $M_i=0$.

The first time in step 100 is the time when a high-voltage-on instruction is obtained from a vehicle control unit (VCU) after a BMS self-test of the battery pack is complete. The BMS self-test of the battery pack includes initialization and fault diagnosis. A signal for indicating performing BMS self-test may be sent by the master battery management unit to the slave battery management units. After the BMS self-test is completed for all the battery packs, the master battery management unit will receive a high-voltage-on instruction from the vehicle control unit. Upon receipt of the high-voltage-on instruction, namely at the first time, the master battery management unit connects the first battery pack with the largest battery pack voltage to the operating circuit. The battery pack voltage may be a sum of voltages of battery cells in the battery pack or a terminal voltage of the battery pack acquired through a high voltage acquisition unit. After the first battery pack has been connected to the operating circuit, step 200 is performed: at each time (i=2, 3, 4 . . . ), determining $M_i$ battery packs not connected to the operating circuit, for which differences between the battery pack voltages and the sampling voltage at the current time are less than corresponding voltage difference thresholds, and connecting an i-th battery pack with the largest voltage difference among the $M_i$ battery packs to the operating circuit. At each time (i=2, 3, 4 . . . ), step 200 is repeated until $M_i=0$ as described in step 300. $M_i=0$ means that at the current time, there is no battery pack satisfying that the difference between the battery pack voltage and the sampling voltage is less than the corresponding voltage difference threshold. In other words, no battery pack can be connected to the operating circuit at the current time. In this case, the battery packs not connected to the operating circuit remain disconnected from the operating circuit, the master battery management unit sends a high-voltage-on complete instruction, and the master battery management unit requests, based on a quantity of the battery packs connected to the operating circuit, allowable discharge power and outputs power for discharging.

For discharging control in this embodiment of this application, during the process of connection for a high voltage, each time before the slave battery management unit controls a battery pack to connect to the operating circuit, the slave battery management unit determines whether any battery pack meets the following condition: a difference between the battery pack voltage and the sampling voltage is less than a corresponding voltage difference threshold. The voltage difference threshold is set as follows: a loop current corresponding to the voltage difference threshold is within a safe loop current value range. In this case, if a battery pack meets this condition, it can be predetermined that a loop current generated from connecting the battery pack to the operating circuit is also within the safe loop current value range. The control method of this embodiment ensures that a battery pack is controlled to connect to the operating circuit, with a loop current generated within the safe value range. This avoids impact on the relay caused by an excessively large loop current generated from connecting a battery pack to the operating circuit, and prevents sticking, shorter service life, or damage to battery cells, thereby effectively protecting battery cells and relays of the battery packs connected to the circuit. In addition, the control method does not rely on a balancing resistor, avoiding energy loss. A function of the relay is to connect a battery pack to the operating circuit or disconnect a battery pack from the operating circuit by turning on or off the relay.

In some embodiments of this application, in the step of obtaining, from the (N−i+1) differences, $M_i$ differences less than corresponding voltage difference thresholds, the voltage difference threshold $\Delta V$ is calculated as follows:

$$\Delta V = (R_i + R_j) \times I_x$$

$$I_x = \text{Min}(y(x)map, F(x)map)$$

$R_i$ and $R_j$ are an internal resistance of the battery pack connected to the operating circuit and an internal resistance of the battery pack not connected to the operating circuit. The internal resistance is calculated according to $R=f(x)=(\alpha T, \beta SOC, \delta SOH)$. That is, the internal resistance of a battery pack is obtained through real-time calculation of a mathematical model based on temperature T, SOC (a percentage of available capacity to actual capacity), and SOH (a percentage of remaining available capacity). $I_x$ is an allowable discharge current of a battery pack, which is the smaller one of $y(x)map$ and $F(x)map$. $y(x)map$ is an allowable discharge current obtained based on the discharge current map of the slave battery management unit under the current temperature and SOC value. $F(x)map$ is a maximum loop current that allows the relay to be turned on without impairing the capacitive life of the relay. Therefore, the voltage difference threshold $\Delta V$ for allowing a battery pack to be connected to the operating circuit can be calculated by obtaining, in real time based on $I_x$, the maximum safe loop current generated by the battery pack allowed to be connected to the operating circuit.

In the embodiment of this application, each of the voltage difference thresholds corresponding to the (N−i+1) differences is a threshold that dynamically changes in real time. The voltage difference threshold is obtained based on the allowable discharge current and internal resistance of each battery pack, where the allowable discharge current of the battery pack is the allowable discharge current under a temperature and an SOC value of the battery pack at a current time or the maximum safe loop current when the relay is turned on. Therefore, the voltage difference threshold calculated based on the maximum safe loop current allows battery packs to be connected to the operating circuit as much as possible while ensuring that a loop current generated from connecting the battery pack to the operating circuit is within a safe value range, thereby reducing a quantity of battery packs that cannot be connected to the operating circuit.

In some optional implementations, the discharging control method further includes:
determining that a current time is the i-th time after receiving an instruction indicating completion of connecting the (i−1)-th battery pack to the operating circuit; where the instruction indicating completion of connecting the (i−1)-th battery pack to the operating circuit is sent by a slave battery management unit corresponding to the (i−1)-th battery pack.

Figure 3:
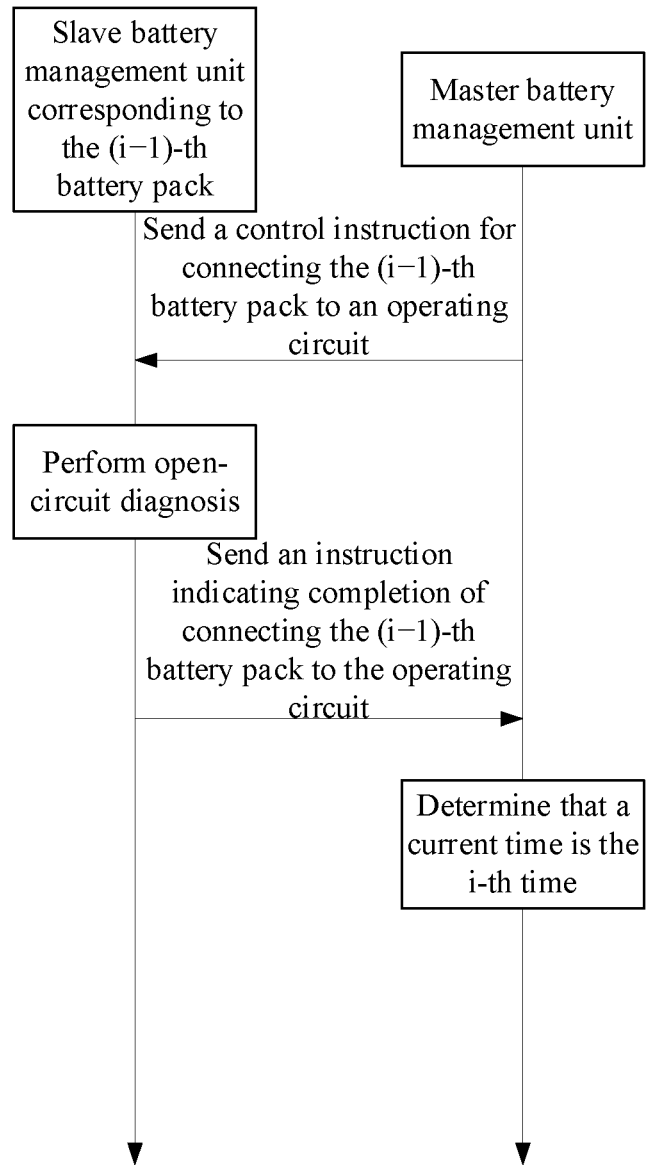
FIG. 3 is a working flowchart of open-circuit diagnosis according to an embodiment of this application.

Referring to FIG. 3, FIG. 3 is a working flowchart of open-circuit diagnosis according to an embodiment of this application. After the master battery management unit sends, to the slave battery management unit corresponding to the (i−1)-th battery pack, an instruction for connecting the (i−1)-th battery pack to the operating circuit, the slave battery management unit corresponding to the (i−1)-th battery pack will perform an open-circuit diagnosis on a relay of the (i−1)-th battery pack. If no open-circuit fault is present, the slave battery management unit corresponding to the (i−1)-th battery pack determines that the relay of the (i−1)-th battery pack has been turned on and sends to the master battery management unit an instruction indicating completion of connecting the (i−1)-th battery pack to the operating circuit. After receiving this instruction, the master battery management unit determines that the current time is the i-th time. During the discharging control process, the open-circuit diagnosis is performed each time the relay of the battery pack is controlled to be turned on, to ensure smooth implementation of the subsequent control process.

In some optional implementations, after connection for a high voltage is completed during discharging control, when the electric vehicle is in operation, the battery packs connected to the operating circuit discharge, and the voltages thereof drop, gradually approaching the voltages of the battery packs not connected to the operating circuit. In this case, the discharging control method further includes: obtaining a sampling voltage, a sampling current, and a voltage of a battery pack not connected to the operating circuit, and sending, to a slave battery management unit corresponding to a battery pack meeting a first condition, a control instruction for connecting the battery pack to the operating circuit; where the first condition includes: calculating a difference between the voltage of the battery pack not connected to the operating circuit and the sampling voltage, and when the difference is within a corresponding voltage difference range, determining that the sampling current is less than a specified threshold and remains for a preset period of time. The range of the voltage difference between the voltage $V_{BatVolt}$ of the battery pack not connected to the operating circuit and the sampling voltage $V_{LINK}$
is $\Delta V_{min} < (V_{BatVolt} - V_{LINK}) < \Delta V_{max}$, where $\Delta V_{min} = \Delta V - U_0$, $\Delta V_{max} = \Delta V + U_0$, $\Delta V$ is a product of a maximum loop current and an internal resistance, and $U_0$ is a specified sampling error and a tolerance threshold for determining overcurrent.

In the embodiments of this application, after connection for a high voltage is completed during discharging control, when the electric vehicle is in operation, the master battery management unit monitors change of the sampling voltage in real time, predicts the timing of connecting a remaining battery pack that has not been connected to the operating circuit to the operating circuit. In the embodiments, the timing is: the difference between the voltage of the battery pack not connected to the operating circuit and the sampling voltage is within the voltage difference range and the sampling current is less than a specified threshold. At this timing, the control instruction for connecting the battery pack to the operating circuit is sent to the slave battery management unit corresponding to the battery pack, so that all the battery packs with large voltage differences can be connected to the operating circuit, avoiding the problems of insufficient output power and shorter driving range caused by discharging failure of some battery packs due to voltage difference.

In some optional implementations, after connection for a high voltage is completed during discharging control, when the electric vehicle is in operation, the battery packs connected to the operating circuit discharge, and the voltages thereof drop, gradually approaching the voltages of the battery packs not connected to the operating circuit. In this case, the discharging control method further includes: obtaining a sampling voltage, a sampling current, and a voltage of a battery pack not connected to the operating circuit, and sending, to a battery pack meeting a second condition, a control instruction for connecting the battery pack to the operating circuit; where the second condition includes: calculating a difference between the voltage of the battery pack not connected to the operating circuit and the sampling voltage, and when the difference is within a voltage difference range, reducing the sampling current by controlling output power, and determining that the sampling current is less than a specified threshold and remains for a preset period of time. The value of is set based on the following considerations: (1) driving conditions of the electric vehicle, that is, prioritizing the safe driving of the vehicle; and (2) an internal resistance of polarization of battery cells generated due to current output. That is:

$\vartheta = \min(I\_safety, I\_Resistance)$, where I_safety is a current at a safe vehicle speed, ad I_Resistance is a current under a maximum allowable polarization voltage in dynamic regulation.

In the foregoing technical solution, after connection for a high voltage is completed during discharging control, when the electric vehicle is operating and discharging, the master battery management unit monitors change of the sampling voltage in real time, and predicts the timing of connecting a remaining battery pack that has not been connected to the operating circuit to the operating circuit. In the embodiments, the timing is: when the difference between the voltage of the battery pack not connected to the operating circuit and the sampling voltage is within the voltage difference range, the sampling current is reduced to be less than a specified threshold through dynamic control of output power. At this timing, the control instruction for connecting the battery pack to the operating circuit is sent to the slave battery management unit corresponding to the battery pack, so as to prevent the voltage difference of the battery pack from being larger and improve the consistency between battery cells. In this way, all the battery packs with large voltage differences can be connected to the operating circuit, avoiding the problems of insufficient output power and shorter driving range caused by discharging failure of some battery packs due to voltage difference.

In some optional implementations, during discharging, if a relay of a battery pack needs to be disconnected due to failure of the battery pack, the discharging control method further includes: dynamically adjusting allowable discharge power until a discharge current of a battery pack connected to the operating circuit decreases to a level that does not impair a capacitive life of the relay, and sending, to a slave battery management unit corresponding to the battery pack, an instruction for disconnecting the battery pack from the operating circuit; and after receiving an instruction indicating completion of disconnecting the battery pack from the operating circuit, requesting new allowable discharge power based on all battery packs connected to the operating circuit.

In the embodiments of this application, during discharging, before the battery pack is disconnected from the operating circuit, current is reduced by dynamically adjusting the allowable discharge power until the current decreases to a level that does not impair the capacitive life of the relay, the relay is controlled to be off to disconnect the battery pack from the operating circuit. This protects the relay from being damaged when the battery pack is disconnected from the operating circuit.

Figure 4:
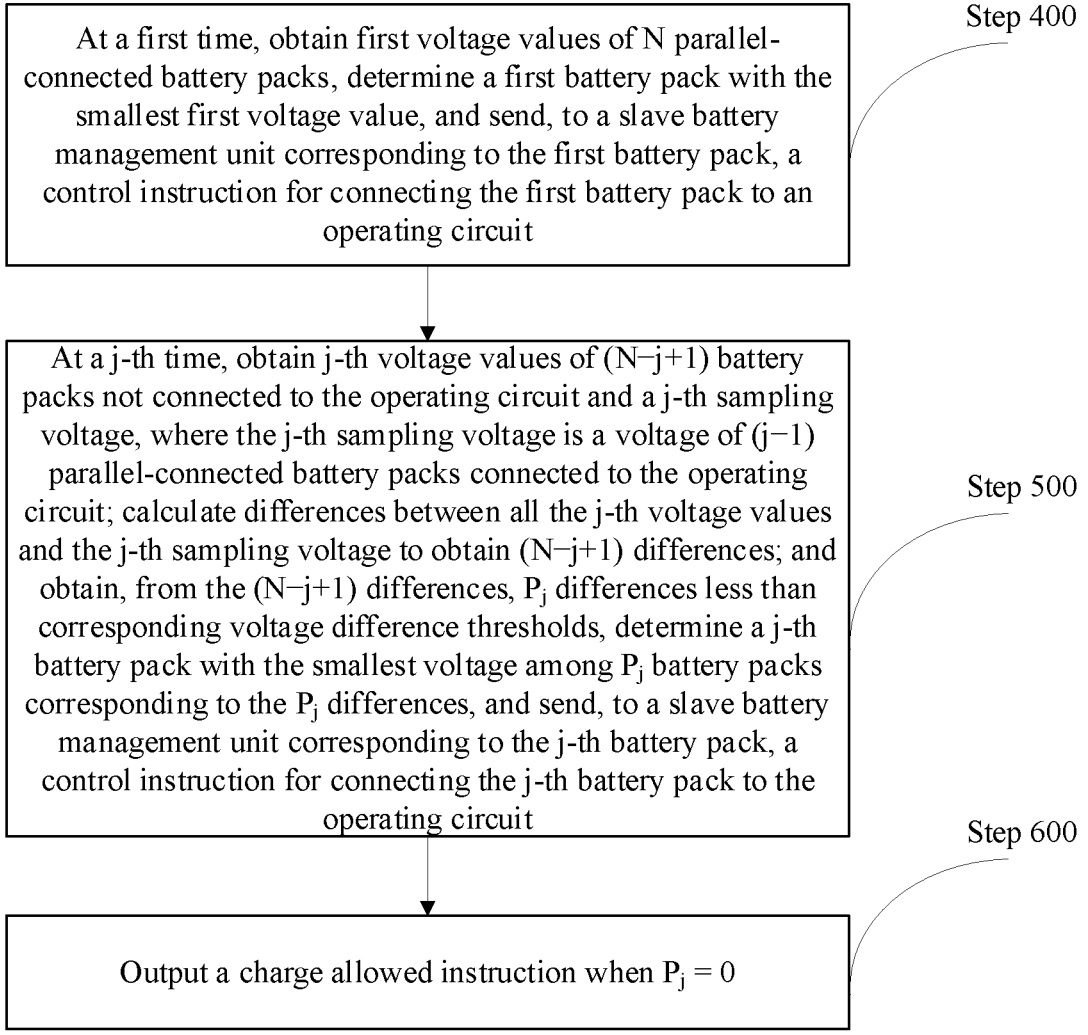
FIG. 4 is a flowchart of steps of a charging control method for a battery pack control system according to an embodiment of this application.

Referring to FIG. 4, FIG. 4 is a flowchart of steps of a charging control method for a battery pack control system according to an embodiment of this application. The charging control method is applied to a master battery management unit, and the charging control method includes step 400 to step 600.

Step 400. At a first time, obtain first voltage values of N parallel-connected battery packs, determine a first battery pack with the smallest first voltage value, and send, to a slave battery management unit corresponding to the first battery pack, a control instruction for connecting the first battery pack to an operating circuit; where N is a positive integer greater than or equal to 2.

Step 500. At a j-th time, obtain j-th voltage values of (N−j+1) battery packs not connected to the operating circuit and a j-th sampling voltage, where the j-th sampling voltage is a voltage of (j−1) parallel-connected battery packs connected to the operating circuit; calculate differences between all the j-th voltage values and the j-th sampling voltage to obtain (N−j+1) differences; and obtain, from the (N−j+1) differences, $P_j$ differences less than corresponding voltage difference thresholds, determine a j-th battery pack with the smallest voltage among $P_j$ battery packs corresponding to the $P_j$ differences, and send, to a slave battery management unit corresponding to the j-th battery pack, a control instruction for connecting the j-th battery pack to the operating circuit; where j is a positive integer greater than or equal to 2, and $P_j$ is an integer greater than or equal to 0.

Step 600. Output a charge allowed instruction when $P_j=0$.

The first time in step 400 is the time when a charging request is received. At the first time, the first battery pack with the lowest battery pack voltage is connected to the operating circuit. After the first battery pack has been connected to the operating circuit, step 500 is performed: at each time (j=2, 3, 4 . . . ), determining $P_j$ battery packs not connected to the operating circuit, for which differences between the battery pack voltages and the sampling voltage at the current time are less than corresponding voltage difference thresholds, and connecting a j-th battery pack with the smallest voltage difference among the $P_j$ battery packs to the operating circuit. At each time (j=2, 3, 4 . . . ), step 500 is repeated until $P_j=0$ as described in step 600. $P_j=0$ means that there is no battery pack satisfying that the difference between the battery pack voltage and the sampling voltage is less than the corresponding voltage difference threshold at the current time. In other words, no battery pack can be connected to the operating circuit at the current time. In this case, the battery packs not connected to the operating circuit remain disconnected from the operating circuit, the master battery management unit sends a high-voltage-on complete instruction, and the master battery management unit requests allowable charging power based on a quantity of the battery packs connected to the operating circuit.

For charging control in this embodiment of this application, during the process of connection for a high voltage, each time before the slave battery management unit controls a battery pack to connect to the operating circuit, the slave battery management unit determines whether any battery pack meets the following condition: a difference between the battery pack voltage and the sampling voltage is less than a corresponding voltage difference threshold. The voltage difference threshold is set as follows: a loop current corresponding to the voltage difference threshold is within a safe loop current value range. In this case, if a battery pack meets this condition, it can be predetermined that a loop current generated from connecting the battery pack to the operating circuit is also within the safe loop current value range. The control method of this embodiment ensures that a battery pack is controlled to connect to the operating circuit, with a loop current generated within the safe value range. This avoids impact on the relay caused by an excessively large loop current generated from connecting a battery pack to the operating circuit, and prevents sticking, shorter service life, or damage to battery cells, thereby effectively protecting battery cells and relays of the battery packs connected to the circuit. In addition, the control method does not rely on a balancing resistor, avoiding energy loss. A function of the relay is to connect a battery pack to the operating circuit or disconnect a battery pack from the operating circuit by turning on or off the relay.

In some optional embodiments, in the step of obtaining, from the (N−j+1) differences, $P_j$ differences less than corresponding voltage difference thresholds, the voltage difference threshold is calculated as follows:

$$\Delta V = (R_i + R_j) \times I_x$$

$$I_x = \mathrm{Min}(Y(x)map, F(x)map)$$

$R_i$ and $R_j$ are an internal resistance of the battery pack connected to the operating circuit and an internal resistance of the battery pack not connected to the operating circuit. The internal resistance is calculated according to R=f(x)= (αT, βSOC, δSOH). That is, the internal resistance of a battery pack is obtained through real-time calculation of a mathematical model based on temperature T, SOC (a percentage of available capacity to actual capacity), and SOH (a percentage of remaining available capacity). $I_x$ is the allowable discharge current of a battery pack, which is the smaller one of y(x)map and F(x)map. Y(x)map is an allowable discharge current obtained based on the discharge current map of the slave battery management unit under the current temperature and SOC value. F(x)map is a maximum loop current that allows the relay to be turned on without impairing the capacitive life of the relay. Therefore, the voltage difference threshold ΔV for allowing a battery pack to be connected to the operating circuit can be calculated by obtaining, in real time based on $I_x$, the maximum safe loop current generated by the battery pack allowed to be connected to the operating circuit.

In the embodiments of this application, each of the voltage difference thresholds corresponding to the (N−j+1) differences is a threshold that dynamically changes in real time. Such voltage difference threshold is obtained based on the allowable charge current and internal resistance of each battery pack, where the allowable charge current of the battery pack is the allowable charge current under a temperature and an SOC value of the battery pack at a current time or a maximum safe loop current when the relay is turned on. Therefore, the voltage difference threshold calculated based on the maximum safe loop current allows battery packs to be connected to the operating circuit as much as possible while ensuring that a loop current generated from connecting the battery pack to the operating circuit is within a safe value range, thereby reducing a quantity of battery packs that cannot be connected to the operating circuit.

In some optional embodiments, the charging control method further includes:
  determining that a current time is the j-th time after receiving an instruction indicating completion of connecting a (j−1)-th battery pack to the operating circuit; where the instruction indicating completion of connecting the (j−1)-th battery pack to the operating circuit is sent by a slave battery management unit corresponding to the (j−1)-th battery pack.

Figure 5:
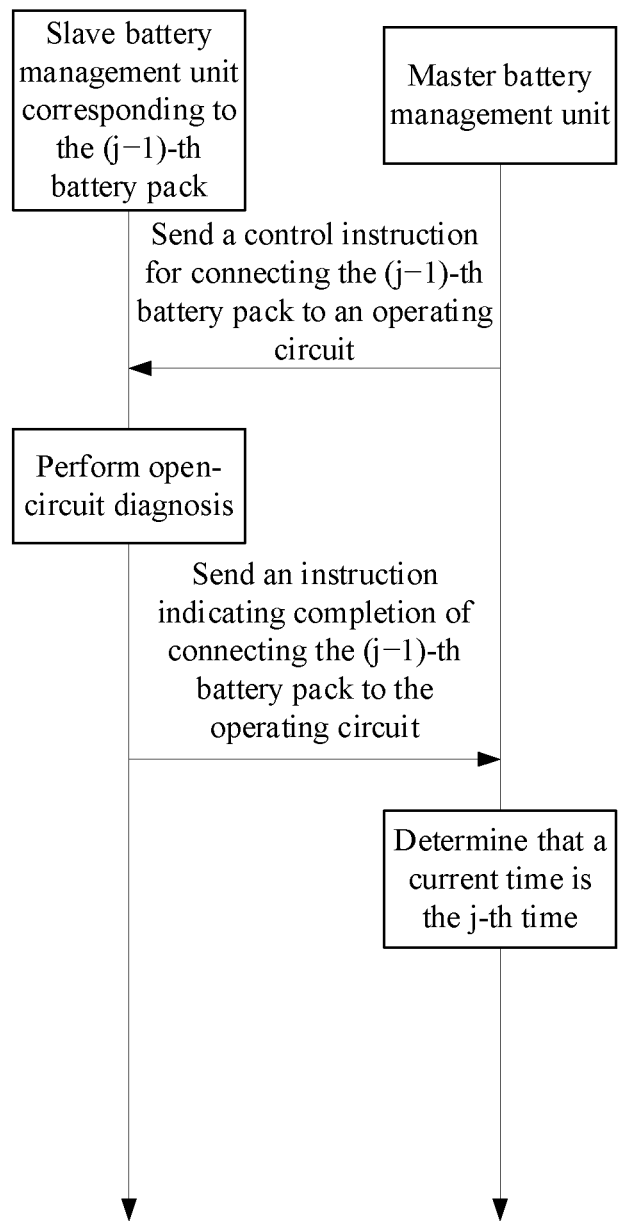
FIG. 5 is a working flowchart of open-circuit diagnosis according to another embodiment of this application.

Referring to FIG. 5, FIG. 5 is a working flowchart of open-circuit diagnosis according to another embodiment of this application. After the master battery management unit sends, to the slave battery management unit corresponding to the (j−1)-th battery pack, an instruction for connecting the (j−1)-th battery pack to the operating circuit, the slave battery management unit corresponding to the (j−1)-th battery pack will perform an open-circuit diagnosis on a relay of the (j−1)-th battery pack. If no open-circuit fault is present, the slave battery management unit corresponding to the (j−1)-th battery pack determines that the relay of the (j−1)-th battery pack has been turned on and sends to the master battery management unit an instruction indicating completion of connecting the (j−1)-th battery pack to the operating circuit. After receiving this instruction, the master battery management unit determines that the current time is the j-th time. During the charging control process, the open-circuit diagnosis is performed each time the relay of the battery pack is controlled to be turned on, to ensure smooth implementation of the subsequent control process.

In some optional implementations, after connection for a high voltage is completed, voltages of the battery packs connected to the operating circuit gradually rise during charging of multiple parallel-connected battery packs. In this case, the charging control method further includes: obtaining a sampling voltage, a sampling current, and a voltage of a battery pack not connected to the operating circuit, and sending, to a slave battery management unit corresponding to a battery pack meeting a third condition, a control instruction for connecting a battery pack to the operating circuit; where the third condition includes: calculating a difference between the voltage of the battery pack not connected to the operating circuit and the sampling voltage, and when the difference is within a corresponding voltage difference range, performing reduced-rate charging control on all battery packs connected to the operating circuit until a charging rate drops to a target value.

In the embodiments of this application, after connection for a high voltage is completed during charging control, the multiple parallel-connected battery packs connected to the operating circuit start to be charged. During charging, the master battery management unit monitors change of the sampling voltage in real time, predicts the timing of connecting a remaining battery pack that has not connected to the operating circuit to the operating circuit. In the embodiments, the timing is: when the difference between the voltage of the battery pack not connected to the operating circuit and the sampling voltage is within the voltage difference range, reduced-rate charging control is performed on all the battery packs connected to the operating circuit until a charging rate drops to a target value. At this timing, a control instruction for connecting the battery pack to the operating circuit is sent to the slave battery management unit corresponding to the battery pack. This avoids charging overcurrent caused by loop currents generated from connecting battery packs to the operating circuit during charging, and enables battery packs with a large voltage difference to be all connected to the operating circuit, thereby solving the problem that the battery packs with a large voltage difference cannot be charged, and effectively improving battery availability.

In some optional implementations, the performing reduced-rate charging control on all battery packs connected to the operating circuit until a charging rate drops to a target value includes:

when the difference between the voltage $V_{BatVolt}$ of the battery pack not connected to the operating circuit and the sampling voltage $V_{LINK}$ is within a voltage difference range $\Delta V_{min}<(V_{BatVolt}-V_{LINK})<\Delta V_{max}$, performing charging at a charging rate σi obtained by multiplying a current look-up charging rate by a gradient coefficient φi, performing charging at the sampling voltage until $V_{LINK}=\Delta V+V_{BatVolt}$ and remains unchanged for τs, and then changing to a next gradient coefficient, where $\Delta V_{min}=\Delta V-U_0$, $\Delta V_{max}=\Delta V+U_0$; $\Delta V$ is a product of a maximum loop current and an internal resistance, and $U_0$ is a specified sampling error and a tolerance threshold for determining overcurrent; and repeating the foregoing steps until σi=0.1 C, and performing charging at the sampling voltage until $V_{LINK}=\Delta V+V_{BatVolt}$ and remains unchanged for τs.

In the embodiments of this application, charging control is performed at a step-wise decreasing rate. This improves the overall charging efficiency as compared with a manner of directly reducing the charging rate to a target value.

In some optional implementations, during charging, if a relay of a battery pack needs to be disconnected due to failure of the battery pack, the charging control method further includes: dynamically adjusting allowable charging power until a charge current of a battery pack connected to the operating circuit decreases to a level that does not impair a capacitive life of the relay, and sending, to a slave battery management unit corresponding to the battery pack, an instruction for disconnecting the battery pack from the operating circuit; and after receiving an instruction indicating completion of disconnecting the battery pack from the operating circuit, requesting new allowable charging power based on all battery packs connected to the operating circuit.

In the embodiments of this application, during charging, before the battery pack is disconnected from the operating circuit, current is reduced by dynamically adjusting the allowable charging power until the current decreases to a level that does not impair the capacitive life of the relay, and then the relay is controlled to be off to disconnect the battery pack from the operating circuit. This protects the relay from being damaged when the battery pack is disconnected from the operating circuit.

In the embodiments provided in this application, it should be understood that the disclosed apparatus and method may be implemented in other manners. The apparatus embodiment described above is merely an example. For example, such unit division is merely a logical function division, and another division manner may be used during actual implementation. For another example, a plurality of units or components may be combined, or may be integrated into another system, or some features may be ignored or not performed. In addition, the displayed or discussed mutual couplings or direct couplings or communications connections may be implemented by using some communications interfaces. The indirect couplings or communications connections between apparatuses or units may be implemented in electrical, mechanical, or other forms.

Units described as separate components may or may not be physically separate. A component displayed as a unit may be one or more physical units, and may be located in one place, or may be distributed in a plurality of places. Some or all of the units may be selected depending on actual requirements to achieve the objectives of the solutions of the embodiments.

In addition, each functional module in each embodiment of the application may be integrated into an independent part, each module may also independently exist, and two or more than two modules may also be integrated into an independent part.

It should be noted that relational terms such as first and second are only adopted to distinguish one entity or operation from another entity or operation, and are not necessarily required or implied that there is any such actual relationship or order between these entities or operations.

In conclusion, it should be noted that the foregoing embodiments are for description of the technical solutions of this application only rather than for limiting this application. Although this application has been described in detail with reference to the foregoing embodiments, persons of ordinary skill in the art should appreciate that they can still make modifications to the technical solutions described in the embodiments or make equivalent replacements to some or all technical features thereof without departing from the scope of the technical solutions of the embodiments of this application. All such modifications and equivalent replacements shall fall within the scope of claims and specification of this application. In particular, in absence of structural conflict, the various technical features mentioned in the embodiments can be combined in any manner. This application is not limited to the specific embodiments disclosed in this specification but includes all technical solutions falling within the scope of the claims.

What is claimed is:

1. A discharging control method for a battery pack control system, wherein the battery pack control system comprises a master battery management unit and N slave battery management units for controlling N parallel-connected battery packs, the slave battery management units are configured to control the battery packs to connect to an operating circuit or disconnect from the operating circuit, the slave battery management units are in communication connection with the master battery management unit, and N is a positive integer greater than or equal to 2; and wherein the discharging control method is applied to the master battery management unit;

wherein the discharging control method comprising:
at a first time, obtaining first voltage values of the N parallel-connected battery packs, determining a first battery pack with a largest first voltage value, and sending, to a slave battery management unit corresponding to the first battery pack, a control instruction for connecting the first battery pack to the operating circuit;
at an i-th time, obtaining i-th voltage values of (N−i+1) battery packs not connected to the operating circuit and an i-th sampling voltage, wherein the i-th sampling voltage is a voltage of (i−1) parallel-connected battery packs connected to the operating circuit;
calculating differences between all the i-th voltage values and the i-th sampling voltage to obtain (N−i+1) differences; and obtaining, from the (N−i+1) differences, $M_i$ differences less than corresponding voltage difference thresholds, determining an i-th battery pack with the largest voltage among $M_i$ battery packs corresponding to the $M_i$ differences, and sending, to a slave battery management unit corresponding to the i-th battery pack, a control instruction for connecting the i-th battery pack to the operating circuit; wherein i is a positive integer greater than or equal to 2, and $M_i$ is an integer greater than or equal to 0; and outputting a discharge allowed instruction when $M_i=0$.

2. The discharging control method according to claim 1, wherein obtaining, from the (N−i+1) differences, $M_i$ differences less than corresponding voltage difference thresholds comprises:

obtaining the voltage difference thresholds based on an allowable discharge current of each of the (N−i+1) battery packs not connected to the operating circuit and an internal resistance of the corresponding battery pack.

3. The discharging control method according to claim 1, further comprising:

determining that a current time is the i-th time after receiving an instruction indicating completion of connecting the (i−1)-th battery pack to the operating circuit, wherein the instruction indicating completion of connecting the (i−1)-th battery pack to the operating circuit is sent by a slave battery management unit corresponding to the (i−1)-th battery pack.

4. The discharging control method according to claim 1, further comprising:

obtaining a sampling voltage, a sampling current, and a voltage of a battery pack not connected to the operating circuit, and sending, to a slave battery management unit corresponding to a battery pack meeting a first condition, a control instruction for connecting the battery pack to the operating circuit;

wherein the first condition comprises: calculating a difference between the voltage of the battery pack not connected to the operating circuit and the sampling voltage, and when the difference is within a corresponding voltage difference range, determining that the sampling current is less than a specified threshold and remains for a preset period of time;

wherein a range of the voltage difference between the voltage $V_{BatVolt}$ of the battery pack not connected to the operating circuit and the sampling voltage $V_{LINK}$ is $\Delta V_{min} < (V_{BatVolt} - V_{LINK}) < \Delta V_{max}$, wherein $\Delta V_{min} = \Delta V - U_0$, $\Delta V_{max} = \Delta V + U_0$, $\Delta V$ is a product of a maximum loop current and an internal resistance, and $U_0$ is a specified sampling error and a tolerance threshold for determining overcurrent.

5. The discharging control method according to claim 1, further comprising:

obtaining a sampling voltage, a sampling current, and a voltage of a battery pack not connected to the operating circuit, and sending, to a battery pack meeting a second condition, a control instruction for connecting the battery pack to the operating circuit;

wherein the second condition comprises: calculating a difference between the voltage of the battery pack not connected to the operating circuit and the sampling voltage, and when the difference is within a voltage difference range, reducing the sampling current by controlling output power, and determining that the sampling current is less than a specified threshold and remains for a preset period of time.

6. The discharging control method according to claim 1, further comprising:

dynamically adjusting allowable discharge power until a discharge current of one of the battery packs connected to the operating circuit decreases to a level that does not impair a capacitive life of a relay, and sending, to a slave battery management unit corresponding to the battery pack, an instruction for disconnecting the battery pack from the operating circuit; and after receiving an instruction indicating completion of disconnecting the battery pack from the operating circuit, requesting new allowable discharge power based on all battery packs connected to the operating circuit.

7. A charging control method for a battery pack control system, applied to a master battery management unit, the method comprising:

at a first time, obtaining first voltage values of N parallel-connected battery packs, determining a first battery pack with a smallest first voltage value, and sending, to a slave battery management unit corresponding to the first battery pack, a control instruction for connecting the first battery pack to an operating circuit; wherein N is a positive integer greater than or equal to 2;

at a j-th time, obtaining j-th voltage values of (N−j+1) battery packs not connected to the operating circuit and a j-th sampling voltage, wherein the j-th sampling voltage is a voltage of (j−1) parallel-connected battery packs connected to the operating circuit;

calculating differences between all the j-th voltage values and the j-th sampling voltage to obtain (N−j+1) differences; and obtaining, from the (N−j+1) differences, $P_j$ differences less than corresponding voltage difference thresholds, determining a j-th battery pack with the smallest voltage among $P_j$ battery packs corresponding to the $P_j$ differences, and sending, to a slave battery management unit corresponding to the j-th battery pack, a control instruction for connecting the j-th battery pack to the operating circuit; wherein j is a positive integer greater than or equal to 2, and $P_j$ is an integer greater than or equal to 0; and outputting a charge allowed instruction when $P_j=0$.

8. The charging control method according to claim 7, wherein obtaining, from the (N−j+1) differences, $P_j$ differences less than corresponding voltage difference thresholds comprises:

obtaining the voltage difference thresholds based on an allowable charge current of each of the (N−j+1) battery packs not connected to the operating circuit and an internal resistance of the corresponding battery pack.

9. The charging control method according to claim 7, further comprising:

determining that a current time is the j-th time after receiving an instruction indicating completion of connecting a (j−1)-th battery pack to the operating circuit, wherein the instruction indicating completion of connecting a (j−1)-th battery pack to the operating circuit is sent by a slave battery management unit corresponding to the (j−1)-th battery pack.

10. The charging control method according to claim 7, further comprising:

obtaining a sampling voltage, a sampling current, and a voltage of a battery pack not connected to the operating circuit, and sending, to a slave battery management unit corresponding to a battery pack meeting a third condition, a control instruction for connecting the battery pack to the operating circuit;

wherein the third condition comprises:
calculating a difference between the voltage of the battery pack not connected to the operating circuit and the sampling voltage, and when the difference is within a corresponding voltage difference range, performing reduced-rate charging control on all battery packs connected to the operating circuit until a charging rate drops to a target value.

11. The charging control method according to claim 10, wherein performing reduced-rate charging control on all battery packs connected to the operating circuit until a charging rate drops to a target value comprises:
when the difference between the voltage $V_{BatVolt}$ of the battery pack not connected to the operating circuit and the sampling voltage $V_{LINK}$ is within a voltage difference range $\Delta V_{min} < (V_{BatVolt} - V_{LINK}) < \Delta V_{max}$, charging at a charging rate $\sigma_i$ obtained by multiplying a current look-up charging rate by a gradient coefficient $\sigma i$ performing charging at the sampling voltage until $V_{LINK} = \Delta V + V_{BatVolt}$ and remains unchanged for $\tau s$, and then changing to a next gradient coefficient, wherein $\Delta V_{min} = \Delta V - U_0$, $\Delta V_{max} = \Delta V + U_0$; $\Delta V$ is a product of a maximum loop current and an internal resistance, and $U_0$ is a specified sampling error and a tolerance threshold for determining overcurrent; and
repeating the foregoing steps until $\sigma i = 0.1$ C, and performing charging at the sampling voltage until $V_{LINK} = \Delta V + V_{BatVolt}$ and remains unchanged for $\tau s$.

12. The charging control method according to claim 7, further comprising:
dynamically adjusting allowable charging power until a charge current of a battery pack connected to the operating circuit decreases to a level that does not impair a capacitive life of a relay, and sending, to a slave battery management unit corresponding to the battery pack, an instruction for disconnecting the battery pack from the operating circuit; and
after receiving an instruction indicating completion of disconnecting the battery pack from the operating circuit, requesting new allowable charging power based on all battery packs connected to the operating circuit.

* * * * *